(12) United States Patent
Ghyselen et al.

(10) Patent No.: US 12,356,858 B2
(45) Date of Patent: Jul. 8, 2025

(54) METHOD FOR THE PRODUCTION OF A SINGLE-CRYSTAL FILM, IN PARTICULAR PIEZOELECTRIC

(71) Applicant: Soitec, Bernin (FR)

(72) Inventors: Bruno Ghyselen, Seyssinet (FR); Jean-Marc Bethoux, La Buisse (FR)

(73) Assignee: Soitec, Bernin (FR)

( * ) Notice: Subject to any disclaimer, the term of this patent is extended or adjusted under 35 U.S.C. 154(b) by 881 days.

(21) Appl. No.: 17/396,374

(22) Filed: Aug. 6, 2021

(65) Prior Publication Data

US 2021/0367139 A1 Nov. 25, 2021

Related U.S. Application Data

(62) Division of application No. 16/064,416, filed as application No. PCT/EP2016/082245 on Dec. 21, 2016, now Pat. No. 11,101,428.

(30) Foreign Application Priority Data

Dec. 22, 2015 (FR) ...................................... 1563055

(51) Int. Cl.
*H10N 30/093* (2023.01)
*C01G 31/02* (2006.01)
(Continued)

(52) U.S. Cl.
CPC ......... *H10N 30/093* (2023.02); *C30B 25/186* (2013.01); *C30B 29/22* (2013.01);
(Continued)

(58) Field of Classification Search
None
See application file for complete search history.

(56) References Cited

U.S. PATENT DOCUMENTS

| 2,738,939 A | 3/1956 | Johnson |
| 4,019,200 A | 4/1977 | Adkins et al. |

(Continued)

FOREIGN PATENT DOCUMENTS

| CN | 1139840 A | 1/1997 |
| CN | 1291349 A | 4/2001 |

(Continued)

OTHER PUBLICATIONS

5Teichen et al., Acoustic Components Used for Filtering Review of Different Technolgies, Techniques de l'Ingenieur, E2000, (Feb. 10, 2008), 2 pages.

(Continued)

*Primary Examiner* — Jeffrey D Washville
(74) *Attorney, Agent, or Firm* — TraskBritt

(57) ABSTRACT

A method of manufacturing a monocrystalline layer comprises the following successive steps: providing a donor substrate comprising a piezoelectric material of composition $ABO_3$, where A consists of at least one element from among Li, Na, K, H, Ca; and B consists of at least one element from among Nb, Ta, Sb, V; providing a receiver substrate, transferring a layer called the "seed layer" from the donor substrate on to the receiver substrate, such that the seed layer is at the bonding interface, followed by thinning of the donor substrate layer; and growing a monocrystalline layer of composition $A'B'O_3$ on piezoelectric material $ABO_3$ of the seed layer, where A' consists of a least one of the following elements Li, Na, K, H; B' consists of a least one of the following elements Nb, Ta, Sb, V; and A' is different from A or B' is different from B.

20 Claims, 5 Drawing Sheets

(51) Int. Cl.

| | |
|---|---|
| *C01G 33/00* | (2006.01) |
| *C01G 35/00* | (2006.01) |
| *C30B 25/18* | (2006.01) |
| *C30B 29/22* | (2006.01) |
| *C30B 29/30* | (2006.01) |
| *H01L 21/762* | (2006.01) |
| *H03H 9/02* | (2006.01) |
| *H03H 9/54* | (2006.01) |
| *H03H 9/64* | (2006.01) |
| *H10N 30/072* | (2023.01) |
| *H10N 30/076* | (2023.01) |
| *H10N 30/079* | (2023.01) |
| *H10N 30/853* | (2023.01) |

(52) U.S. Cl.
CPC ........ *C30B 29/30* (2013.01); *H01L 21/76254* (2013.01); *H03H 9/02031* (2013.01); *H03H 9/02574* (2013.01); *H03H 9/54* (2013.01); *H03H 9/64* (2013.01); *H10N 30/072* (2023.02); *H10N 30/079* (2023.02); *H10N 30/8542* (2023.02); *C01G 31/02* (2013.01); *C01G 33/00* (2013.01); *C01G 35/00* (2013.01); *H10N 30/076* (2023.02)

(56) References Cited

U.S. PATENT DOCUMENTS

| | | | |
|---|---|---|---|
| 5,935,641 | A | 8/1999 | Beam et al. |
| 6,540,827 | B1 * | 4/2003 | Levy ............... H01L 21/76254 438/458 |
| 6,593,212 | B1 * | 7/2003 | Kub ............... H01L 21/76254 438/22 |
| 2003/0199105 | A1 | 10/2003 | Kub et al. |
| 2004/0226162 | A1 | 11/2004 | Miura et al. |
| 2008/0284541 | A1 | 11/2008 | Chitnis |
| 2009/0075066 | A1 | 3/2009 | Shibata et al. |
| 2010/0088868 | A1 | 4/2010 | Kando et al. |
| 2010/0141086 | A1 | 6/2010 | Suzuki et al. |
| 2013/0234564 | A1 | 9/2013 | Sakashita et al. |
| 2014/0339962 | A1 | 11/2014 | Furukawa et al. |
| 2015/0243549 | A1 | 8/2015 | Letertre et al. |
| 2018/0375014 | A1 * | 12/2018 | Ghyselen ............ H10N 30/072 |
| 2021/0118936 | A1 | 4/2021 | Schwarzenbach |

FOREIGN PATENT DOCUMENTS

| | | |
|---|---|---|
| CN | 1708843 A | 12/2005 |
| CN | 102253451 A | 11/2011 |
| EP | 2738939 A1 | 6/2014 |
| JP | 08-153915 A | 6/1996 |
| JP | 2001-122699 A | 5/2001 |
| JP | 2001-285019 A | 10/2001 |
| JP | 2003-168762 A | 6/2003 |
| JP | 2007-281238 A | 10/2007 |
| JP | 2008-211277 A | 9/2008 |
| JP | 2009-530833 A | 8/2009 |
| JP | 2004-179630 | 11/2010 |
| JP | 2008-283689 A | 8/2012 |
| JP | 2012-518284 A | 8/2012 |
| JP | 2013-201449 A | 10/2013 |
| KR | 10-2011-0126532 A | 11/2011 |
| KR | 10-2012-0084295 A | 7/2012 |
| KR | 10-2019-0061070 A | 6/2019 |
| WO | 02/09160 A2 | 1/2002 |
| WO | 2005/050836 A1 | 6/2005 |
| WO | 2009/081651 A1 | 7/2009 |
| WO | 2011/042388 A1 | 4/2011 |
| WO | 2012/128268 A1 | 9/2012 |
| WO | 2013/018604 | 2/2013 |
| WO | 2014/020906 A1 | 2/2014 |

OTHER PUBLICATIONS

Bartasyte et al., Residual Stresses and Clamped Termal Expansion in LiNbO3 and LiTaO3 Thin Films, Applied Physics Letters, vol. 101, (2012), pp. 122902-1-122902-5.

Chinese 2nd Notification of Office Action for Chinese Application No. 201680080405.8 dated Mar. 3, 2021.

Chinese Office Action for CN Application No. 201680080405.8, dated Jun. 3, 2020, 13 pages.

Chinese Search Report for CN Application No. 201680080405.8, dated May 26, 2020, 2 pages.

Dogheche et al., High-Frequency Surface Acoustic Wave Devices Based on LiNbO3/Diamond Multilayered structure, Applied Phys. Lett., vol. 87, (2005), pp. 213503-1-213503-3.

Fukuda et al. Applied Physics Letters, vol. 28, No. 10, 1978, 575-577 (Year: 1978).

Gachon, D. et al., Development of high frequency bulk acoustic wave resonator using thinned single-crystal Lithium Niobate, 2006 IEEE International Frequency Control Symposium and Exposition, Dec. 31, 2006, pp. 810-812.

Herzog, Christian, K1—yNayTa1—xNbx03 Thins Films for Integrated Electro-Optics, Doctoral Thesis, ETH Zurich, (2007), 84 pages.

Hung et al., Epitaxial Nonlinear Optical Films of LiTaO3 Grown on GaAs in Waveguide Form, Appl. Phys. Lett., vol. 62, (1993), pp. 3071-3073.

International Search Report for International Application No. PCT/EP2016/082245 dated May 19, 2017, 2 pages.

International Written Opinion for International Application No. PCT/EP2016/082245 dated May 19, 2017, 9 pages.

Saito et al., Lead-Free Piezoceramics, Nature, vol. 432, (Nov. 4, 2004), pp. 84-87.

Singapore Search Report and Written Opinion for Singapore Application No. 11201805382S, dated Aug. 19, 2019, 10 pages.

Japanese Notification of Reason for Rejection for Japanese Application No. 2020-202217 dated Oct. 19, 2021, 5 pages.

Japanese Notification of Refusal for Application No. 2020-202217 dated May 22, 2022, 4 pages.

Japanese Office Action for JP Application No. 2018-532582 dated Aug. 11, 2020, 5 pages with English Translation.

Office Action for Japanese Application No. 2018-532615, dated Jul. 28, 2020, 6 pages.

Preliminary Report of Patentability for France Application No. 1563057, dated Sep. 8, 2016, 6 pages.

Written Opinion for Singapore Application No. 11201805403R, dated Aug. 19, 2019, 8 pages.

European Communication for Application No. 16819558.4 dated Jul. 14, 2023, 6 pages.

Zhang et al., Performance Improvements of KTN Ferroelectric Thin Films for Microwave Tunable Devices, Proceedings of the 40th European Microwave Conference, Sep. 28-30, 2010, pp. 1202-1205.

Korean Office Action for Application No. 10-2018-7021267 dated Sep. 5, 2023, 18 pages.

Korean Notice of Non-Final Rejection for Application No. 10-2018-7021277 dated Oct. 13, 2023, 6 pages.

\* cited by examiner

METHOD FOR THE PRODUCTION OF A SINGLE-CRYSTAL FILM, IN PARTICULAR PIEZOELECTRIC

CROSS-REFERENCE TO RELATED APPLICATIONS

This application is a divisional of U.S. patent application Ser. No. 16/064,416, filed Jun. 20, 2018, now U.S. Pat. No. 11,101,428, issued Aug. 24, 2021, which is a national phase entry under 35 U.S.C. § 371 of International Patent Application PCT/EP2016/082245, filed Dec. 21, 2016, designating the United States of America and published as International Patent Publication WO 2017/108994 A1 on Jun. 29, 2017, which claims the benefit under Article 8 of the Patent Cooperation Treaty to French Patent Application Serial No. 1563055, filed Dec. 22, 2015, the disclosure of each of which is hereby incorporated herein in its entirety by this reference.

TECHNICAL FIELD

This application concerns a method of manufacturing a monocrystalline layer, in particular, a piezoelectric layer, and more in particular, for an application with a microelectronic, photonic or optical device. In particular, but non-restrictively, the device may be a surface acoustic wave device or a bulk acoustic wave device for radiofrequency applications.

BACKGROUND

Among the acoustic components used for filtering in the radiofrequency field, two main categories of filter can be distinguished:
First, surface acoustic wave filters, known by the acronym SAW (Surface Acoustic Wave); and
Second, bulk acoustic wave filters and resonators, known by the acronym BAW (Bulk Acoustic Wave).
For a review of these technologies, reference may be made to the article by W. Steichen and S. Ballandras, "Acoustic components used for filtering—Review of the different technologies," Techniques de l'Ingenieur [Engineering Technology], E2000, 2008 [1].

Surface acoustic wave filters typically include a thick piezoelectric layer (generally several hundred μm thick) and two electrodes in the form of interdigitated metal combs deposited on the surface of the piezoelectric layer. An electrical signal, typically an electrical voltage variation, applied to an electrode, is converted into an elastic wave, which is propagated on the surface of the piezoelectric layer. Propagation of this elastic wave is facilitated if the frequency of the wave is equal to the frequency band of the filter. This wave is converted once more into an electrical signal when it reaches the other electrode.

For their part, bulk acoustic wave filters typically include a thin piezoelectric layer (i.e., generally roughly less than 1 μm thick) and two electrodes installed on each main face of the thin layer. An electrical signal, typically an electrical voltage variation, applied to an electrode, is converted into an elastic wave, which is propagated through the piezoelectric layer. Propagation of this elastic wave is facilitated if the frequency of the wave is equal to the frequency band of the filter. This wave is converted once more into an electrical signal when it reaches the electrode on the opposite face.

In the case of surface acoustic wave filters, the piezoelectric layer must be of excellent crystalline quality in order not to cause any attenuation of the surface wave. In this case, a monocrystalline layer will, therefore, be preferred. Currently, suitable materials that can be used industrially are quartz, $LiNbO_3$ or $LiTaO_3$. The piezoelectric layer is obtained by cutting an ingot of one of the materials, wherein the accuracy required for the thickness of the layer is unimportant if the waves are to be essentially propagated on its surface.

In the case of bulk acoustic wave filters, the piezoelectric layer must have a determined and uniform thickness throughout the entire layer, in a precisely controlled manner. Conversely, since crystalline quality is secondary in terms of the important criteria for performance of the filter, compromises are currently made concerning the crystalline quality of the layer, and a polycrystalline layer has for a long time been considered to be acceptable. The piezoelectric layer is, therefore, formed by deposition on a supporting substrate (for example, a silicon substrate). At the current time, the materials used industrially for such deposition are ZnO and $Pb(Zr_x,Ti_{1-x})O_3$ (PZT).

The choice of materials is, therefore, very limited with both technologies.

The choice of a material is the outcome of a compromise between different properties of the filter, depending on the specifications of the filter manufacturer. In particular, the electromechanical coupling coefficient of piezoelectric materials are criteria for the choice of material, which must be used for a given application and a given component architecture.

For example, $LiNbO_3$ and $LiTaO_3$ are highly anisotropic materials. Since the coupling coefficient depends on the crystalline orientation, the choice of a particular orientation of the material provides a first degree of freedom for the choice of material. This is why substrates can be found with a multiplicity of crystalline orientations, for example: X-cut, Y-cut, Z-cut, YZ-cut, 36° rotated Y axis, 42° rotated Y axis, etc.

However, except for the fact that they are able to select a particular crystalline orientation, those skilled in the art have only quartz, $LiNbO_3$ and $LiTaO_3$ to design a surface acoustic wave filter, giving only a limited range of parameters to optimize the filter's characteristics, even if several other materials may in the future be added to this list, such as langasite $La_3Ga_5SiO_{14}$, for example.

To allow more freedom in dimensioning bulk acoustic wave filters or surface acoustic wave filters, it would be desirable to be able to use more materials than the materials listed above, provided the quality of the materials is not impaired.

BRIEF SUMMARY

One object of the disclosure is to remedy the above-mentioned disadvantages and, in particular, to devise a method of manufacturing a monocrystalline layer, in particular, a piezoelectric layer, in particular for a surface acoustic wave device, made of materials other than the materials used for this application, in particular, by enabling layers to be obtained that are thin (i.e., less than 20 μm thick, or less than 1 μm thick) and uniform, made of the materials used for surface acoustic wave devices. This method must also enable a larger variety of supporting substrates to be used than in existing bulk acoustic wave devices.

In accordance with the disclosure, a method of manufacturing a monocrystalline layer is described, wherein the method comprises the following successive steps:

provision of a donor substrate comprising a piezoelectric
material of composition $ABO_3$, where
  A consists of at least one element from among: Li, Na,
  K, H;
  B consists of at least one element from among: Nb, Ta,
  Sb, V;
provision of a receiver substrate,
transfer of a layer called the "seed layer" from the donor
  substrate on to the receiver substrate, by bonding the
  donor substrate on the receiver substrate such that the
  seed layer is at the bonding interface, followed by
  thinning of the donor substrate as far as the seed layer;
growth, by epitaxy on piezoelectric material $ABO_3$ of the
  seed layer, of a monocrystalline layer of composition
  $A'B'O_3$, where:
  A' consists of a least one of the following elements: Li,
  Na, K, H;
  B' consists of a least one of the following elements: Nb,
  Ta, Sb, V;
  A' is different from A or B' is different from B.

The expression "layer at the bonding interface" is understood to mean a layer on the side of the face of a first substrate that is bonded to a second substrate, but does not necessarily imply that there is direct contact between the layer and the second substrate. The layer can thus be bonded directly to the second substrate, or be covered by a bonding layer, for example, a dielectric layer, or any other type of layer, through which the bonding is accomplished.

The expression "A is different from A'" is understood to mean that A and A' consist of different elements and/or of the same element(s), but in different stoichiometric proportions.

According to one implementation, A' includes at least one element in common with A, and/or B' includes at least one element in common with B.

The expression "A' includes at least one element in common with A" is understood to mean that a given element (or several elements) are present both in A and in A', in identical or different stoichiometric proportions.

According to one implementation, A' is identical to A when B' is different from B, and B' is identical to B when A' is different from A.

The expression "A' is identical to A" is understood to mean that A' and A consist of the same element(s), in the same stoichiometric proportions.

According to one implementation, A consists of a single element and B consists of a single element.

According to one way of executing the disclosure, the transfer of the seed layer includes the following steps:
  formation of an embrittlement area in the donor substrate
    so as to delimit a layer, called the seed layer, containing
    the piezoelectric material of composition $ABO_3$,
  bonding of the donor substrate on the receiver substrate,
    where the seed layer is at the bonding interface,
  detachment of the donor substrate along the embrittlement
    area so as to transfer the seed layer on to the receiver
    substrate.

Before the step of epitaxy, a proportion of the thickness of the seed layer transferred on to the receiver substrate can be removed.

Advantageously, the thickness of the seed layer is less than 2 µm, and preferably less than 1 µm.

The receiver substrate is advantageously made of a semiconductor material, and includes an intermediate charge-trapping layer between the seed layer and the receiver substrate.

Another object of the disclosure relates to a method of manufacturing a monocrystalline layer, wherein the method comprises the following successive steps:
  provision of a donor substrate comprising a piezoelectric
    material of composition $A'B'O_3$, where
    A' consists of one or more of the following elements:
    Li, Na, K, H;
    B' consists of one or more of the following elements:
    Nb, Ta, Sb, V;
  growth by epitaxy on the piezoelectric material $A'B'O_3$ of
    a monocrystalline layer of composition $A''B''O_3$, where
    A'' consists of one or more of the following elements:
    Li, Na, K, H;
    B'' consists of one or more of the following elements:
    Nb, Ta, Sb, V;
  supply of a receiver substrate,
  transfer of at least a proportion of the epitaxial layer of
    composition $A''B''O_3$ on to the receiver substrate by
    bonding of the donor substrate on the receiver substrate
    through the epitaxial layer, followed by thinning of the
    donor substrate as far as the epitaxial layer of composition $A''B''O_3$.

According to one implementation, after layer of composition $A''B''O_3$ has been transferred on to the receiver substrate, a monocrystalline layer of composition $A'''B'''O_3$ is made to grow, by epitaxy, on the material of composition $A''B''O_3$, where, in composition $A'''B'''O_3$,
  A''' consists of one or more of the following elements: Li,
  Na, K, H;
  B''' consists of one or more of the following elements: Nb,
  Ta, Sb, V.

According to one implementation, A''' is different from A'' or B''' is different from B''.

According to one way of executing the disclosure, the transfer of the at least a proportion of the epitaxial layer of composition $A''B''O_3$ on to the receiver substrate includes the following steps:
  formation of an embrittlement area in the donor substrate
    or in the epitaxial layer of composition $A''B''O_3$, so as
    to delimit a layer that is to be transferred,
  bonding of the donor substrate on to the receiver substrate, where the epitaxial layer of composition $A''B''O_3$
    is at the bonding interface;
  detachment of the donor substrate or of the epitaxial layer
    along the embrittlement area.

According to one implementation, the embrittlement area is formed in the donor substrate and, after the transfer step, the transferred layer is thinned so as to expose the material of composition $A''B''O_3$.

According to one implementation, A'' is different from A' or B'' is different from B'.

According to one implementation, A'' includes at least one element in common with A' and/or B'' includes at least one element in common with B'.

According to one implementation, A'' is identical to A' when B'' is different from B', and B'' is identical to B' when A'' is different from A'.

According to one implementation, A' consists of a single element and B' consists of a single element.

According to one particular way of executing the disclosure, the embrittlement area is formed by ion implantation in the donor substrate.

In a particularly advantageous manner, after the step of epitaxy, the thickness of monocrystalline layer of composition $A''B''O_3$ is between 0.2 and 20 µm.

In addition, at least one electrically insulating layer and/or at least one electrically conducting layer can be formed at the interface between the receiver substrate and the donor substrate.

According to one way of executing the disclosure, the method includes the transfer of at least a proportion of the monocrystalline layer of the receiver substrate on to a final substrate.

Another object relates to a substrate for a microelectronic, photonic or optical device, wherein the substrate comprises a support substrate and a monocrystalline layer of composition $A''B''O_n$, the support substrate, where A'' consists of one or more of the following elements: Li, Na, K, H;

B'' consists of one or more of the following elements: Nb, Ta, Sb, V;

at least one of A'' and B'' consists of at least two elements, and a layer of composition $A'B'O_3$, where A' consists of at least one element from among: Li, Na, K, H, and B' consists of at least one element from among: Nb, Ta, Sb, V, between the support substrate and the layer of composition $A''B''O_3$.

According to one implementation, the substrate also includes, on the layer of composition $A''B''O_3$, a monocrystalline layer of composition $A'''B'''O_3$, where A''' consists of one or more of the following elements: Li, Na, K, H;

B''' consists of one or more of the following elements: Nb, Ta, Sb, V.

Another object concerns a method of manufacturing a surface acoustic wave device including the deposition of electrodes on the surface of a monocrystalline piezoelectric layer, wherein the method comprises the manufacture of the piezoelectric layer by a method as described above.

Another object concerns a surface acoustic wave device, wherein the surface acoustic wave device comprises a monocrystalline piezoelectric layer that can be obtained by a method as described above, and two electrodes installed on the surface of the monocrystalline piezoelectric layer.

Another object concerns a method of manufacturing a bulk acoustic wave device including the deposition of electrodes on two opposite faces of a monocrystalline piezoelectric layer, wherein the method comprises the manufacture of the piezoelectric layer by a method as described above.

Another object concerns a bulk acoustic wave device, wherein the bulk acoustic wave device comprises a monocrystalline piezoelectric layer that can be obtained by a method as described above, and two electrodes installed on two opposite faces of the monocrystalline piezoelectric layer.

Another object of the disclosure concerns a micro-sensor designed to measure a deformation caused by an external stress, wherein the micro-sensor comprises a monocrystalline piezoelectric layer that can be obtained by a method described above.

Another object of the disclosure concerns a micro-actuator designed to cause a deformation of an element or motion of a moving part, through the application of a continuous or variable electric field, wherein the micro-actuator comprises a monocrystalline piezoelectric layer that can be obtained by a method described above.

BRIEF DESCRIPTION OF THE DRAWINGS

Other characteristics and advantages of the disclosure will be seen clearly from the detailed description given below, with reference to the accompanying drawings, in which.

For reasons of legibility of the figures, the illustrated elements are not necessarily represented at scale. Elements designated by the same reference signs in different figures are identical.

DETAILED DESCRIPTION

Figure 1:
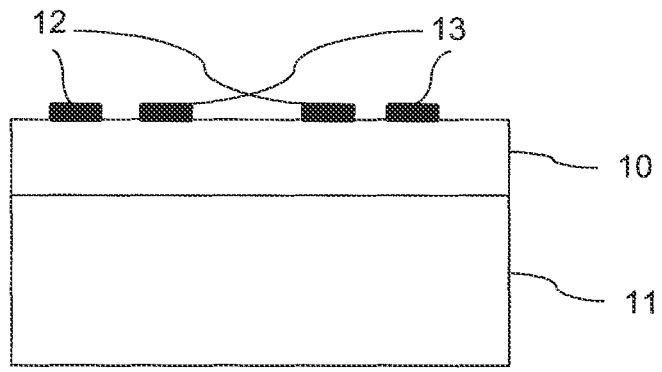
FIG. 1 is a cross-sectional view of a surface acoustic wave filter.

FIG. 1 is a functional cross-sectional view of a surface acoustic wave filter.

The filter includes a piezoelectric layer 10 and two electrodes 12, 13, in the form of two interdigitated metal combs deposited on the surface of the piezoelectric layer. On the side opposite electrodes 12, 13, the piezoelectric layer rests on a support substrate 11. Piezoelectric layer 10 is monocrystalline; indeed, excellent crystalline quality is required in order that no attenuation is caused to the surface wave.

Figure 2:
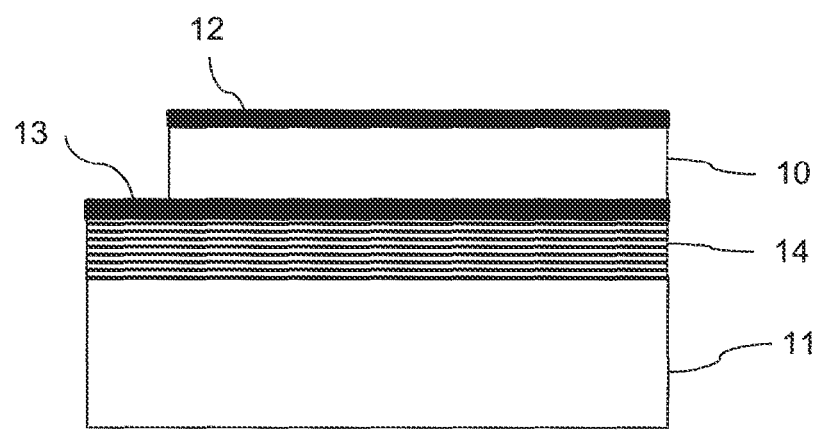
FIG. 2 is a cross-sectional view of a bulk acoustic wave filter.

FIG. 2 is a functional cross-sectional view of a bulk acoustic wave resonator.

The resonator includes a thin piezoelectric layer (i.e., generally less than 1 µm thick, preferably less than 0.2 µm thick) and two electrodes 12, 13 installed either side of the piezoelectric layer 10, which, due to the method of manufacture according to the disclosure, is monocrystalline. Piezoelectric layer 10 rests on a support substrate 11. To isolate the resonator from the substrate and, by this, means to prevent waves propagating in the substrate, a Bragg mirror 14 is interposed between electrode 13 and substrate 11. In an alternative manner (not illustrated), this isolation could be accomplished by making a cavity between the substrate and the piezoelectric layer. These various arrangements are known to those skilled in the art, and will not, therefore, be described in detail in the present text.

In a general manner, the disclosure proposes the formation of the monocrystalline layer, in particular, a piezoelectric layer, by means of epitaxy on a material of a donor substrate, used as a seed for the epitaxy, until the desired thickness is obtained for the monocrystalline layer, and of a transfer to a receiver substrate, where the transfer can be accomplished before the epitaxy (in which case, a surface layer of the donor substrate, called the seed layer, is transferred on to the receiver substrate), or after epitaxy (in which case, at least a proportion of the epitaxial layer is transferred on to the receiver substrate).

The donor substrate can be a homogeneous monocrystalline substrate of the material in question. Alternatively, the donor substrate can be a composite substrate, i.e., in the form of a stack of at least two layers of different materials, a surface layer of which consists of the monocrystalline material in question.

Among the piezoelectric materials of particular interest are the perovskites and similar materials, of structure $ABO_3$.

However, the interest that these materials may hold is not limited to their piezoelectric character. In particular, for other applications, for example, applications relating to integrated optics, they may possibly also be of interest due to their dielectric permittivity, their refraction indices or, alternatively, their pyroelectric, ferroelectric or alternatively ferromagnetic properties, for example, as applicable.

A large family emerges. It is derived, in particular, from binary materials, such as $LiNbO_3$, $LiTaO_3$, $KNbO_3$, $KTaO_3$, leading to a general formula of the $ABO_3$ type, where A consists of one or more of the following elements: Li, Na, K, H, and where B consists of one or more of the following elements: Nb, Ta, Sb, V.

To summarize, it will be considered that A consists of one or more of the following elements: Li, Na, K, H, and B consists of one or more of the following elements: Nb, Ta, Sb, V.

The receiver substrate acts as a mechanical support of the seed layer. It can be of any kind suitable for implementation of epitaxy (in particular, in terms of stability of performance at high temperature), and advantageously, but not imperatively, suitable for the application in question. It can be homogeneous or composite.

At least one intermediate layer can be inserted between the receiver substrate and the seed layer. For example, such an intermediate layer can be electrically conducting or electrically insulating. Those skilled in the art will be able to choose the material and the thickness of this layer according to the properties that they wish the radiofrequency device intended to include and the piezoelectric layer to have.

Advantageously, the receiver substrate can be made of a semiconductor material. This can be, for example, a silicon substrate. This conducting material includes an intermediate layer of the "trap-rich" type, which can either be formed on the receiver substrate, or formed on the surface of the receiver substrate. The intermediate layer of the trap-rich type is thus located between the seed layer and the receiver substrate, and enables the electrical insulation properties of the receiver substrate to be improved. The intermediate layer of the trap-rich type can be formed by at least one of the materials of the polycrystalline, amorphous or porous types, in particular, polycrystalline silicon, amorphous silicon or porous silicon, although is not restricted to these materials. In addition, depending on the stability of performance at high temperature of the intermediate layer of the trap-rich type for accomplishing epitaxy, it may be advantageous to introduce an additional layer between the receiver substrate and the intermediate layer of the trap-rich type, to prevent its recrystallization during a heat treatment.

According to a first implementation, the method includes a transfer of the seed layer of a donor substrate on to a support substrate, followed by the above-mentioned step of epitaxy. In this case, the material of the seed layer is advantageously a material of composition $ABO_3$, where A consists of at least one element from among: Li, Na, K, H, and B consists of at least one element from among: Nb, Ta, Sb, V. According to one implementation, both A and B consist of a single element. For example, the formula of $ABO_3$ can be $Li_{x1}K_{1-x1}Nb_{y1}Ta_{1-y1}O_3$, where x1=0 or 1 and y1=0 or 1. Two very widely used representatives of this family of materials are $LiNbO_3$ and $LiTaO_3$. To a lesser extent, substrates $KNbO_3$ and $KTaO_3$ are also available. In the present text, such a composition is called a binary composition. Such a binary material is generally manufactured by drawing in the form of an ingot. In this case, the composition of the epitaxial layer is advantageously different from the composition of the seed layer, of the $A'B'O_3$ type, where A' consists of one or more of the following elements: Li, Na, K, H; B' consists of one or more of the following elements: Nb, Ta, Sb, V; A' is different from A or B' is different from B. To continue the previous example, the formula of $A'B'O_3$ can be $Li_{x2}K_{1-x2}Nb_{y2}Ta_{1-y2}O_3$, where 0≤x2≤1 and 0≤y2≤1 and where x2 is different from x1 or y2 is different from y1.

In the present text, if the total number of elements comprising A and B is equal to 3, such a composition is called ternary; if the total number of elements comprising A' and B' is equal to 4, such a composition is called quaternary. Unlike with binary materials, such ternary or quaternary materials are not, in the vast majority of cases, obtained by drawing an ingot, but must be obtained by epitaxy on a suitable support in order to be of sufficient quality for the desired dimensions.

In the first implementation, a material of binary composition $ABO_3$ and a material of ternary (or higher order) composition $A'B'O_3$ will be preferred. More specifically, preference will be given to the preceding $ABO_3$ and $A'B'O_3$ compositions in which A' includes at least one element in common with A, and/or B' includes at least one element in common with B, where this element in common is advantageously the predominant one in the composition of A or B. In an even more preferred manner, the preceding $ABO_3$ and $A'B'O_3$ compositions will be chosen in which A' is identical to A when B' is different from B, and B' is identical to B when A' is different from A. A' may possibly be appreciably identical to A, or B' appreciably identical to B, when the content of a majority element of A or B varies slightly (for example, when A is Li and A' is $Li_{0.9}Na_{0.1}$, or alternatively when B is $Ta_{0.5}Nb_{0.5}$ and B' is $Ta_{0.6}Nb_{0.4}$).

According to a second implementation, the step of epitaxy is accomplished before the transfer step. In this case, the donor substrate material serving as the seed for the epitaxy is a material of composition $A'B'O_3$, where A' consists of one or more of the following elements: Li, Na, K, H; B' consists of one or more of the following elements: Nb, Ta, Sb, V. In this case, the composition of the epitaxial layer is of the $A''B''O_3$ type, where A'' consists of one or more of the following elements: Li, Na, K, H; B'' consists of one or more of the following elements: Nb, Ta, Sb, V. For example, the composition of the seed layer is $Li_{x1}K_{1-x1}Nb_{y1}Ta_{1-y1}O_3$, where 0≤x1≤1 and 0≤y1≤1 and the composition of the epitaxial layer is $Li_{x2}K_{1-x2}Nb_{y2}Ta_{1-y2}O_3$, where 0≤x2≤1 and 0≤y2≤1. The material of the epitaxial layer can be identical to that of the seed layer (in other words, A' is identical to A'' and B' is identical to B'', i.e., in the above-mentioned example, x1=x2 and y1=y2). Alternatively, the material of the epitaxial layer is different from that of the seed layer (in other words, A' is different from A'' or B' is different from B''; i.e., in the above-mentioned example, x1 is different from x2 or y1 is different from y2).

In the second implementation, a material of binary composition $A'B'O_3$ and a material of ternary (or higher order) composition $A''B''O_3$ will be preferred. More specifically, preference will be given to the preceding $A'B'O_3$ and $A''B''O_3$ compositions in which A'' includes at least one element in common with A', and/or B'' includes at least one element in common with B', where this element in common is advantageously the predominant one in the composition of A or B. In an even more preferred manner, the preceding $A'B'O_3$ and $A''B''O_3$ compositions will be chosen in which A'' is identical to A' when B'' is different from B', and B'' is identical to B' when A'' is different from A'. A' may possibly be appreciably identical to A, or B' appreciably identical to B, when the content of a majority element of A or B varies slightly (for example, when A is Li and A' is $Li_{0.9}Na_{0.1}$ or, alternatively, when B is $Ta_{0.5}Nb_{0.5}$ and B' is $Ta_{0.6}Nb_{0.4}$).

According to a variant of the second implementation, the method also includes, after the transfer step, the resumption of epitaxy on the transferred layer, so as to form a monocrystalline layer of composition A'''B'''O$_3$, where A''' consists of one or more of the following elements: Li, Na, K, H; B''' consists of one or more of the following elements: Nb, Ta, Sb, V. For example, the composition of the additional epitaxial layer can be of the $Li_{x3}K_{1-x3}Nb_{y3}Ta_{1-y3}O_3$ type, where $0\le x3\le 1$ and $0\le y3\le 1$. x3 is preferably different from x2 or y3 is different from y2 (in other words, more generally, A''' is different from A'' or B''' is different from B'').

The disclosure thus enables, in particular, a thin layer of a compound A'B'O$_3$, A''B''O$_3$, or A'''B'''O$_3$, to be formed of excellent crystalline quality, and at least equal to that of the homogeneous substrates of the binary materials of this family, with a controlled thickness in a very wide range of thicknesses and, in particular, for a thickness of less than 20 µm, and a large variety of properties that can be adjusted through the composition of the material.

The epitaxy can be accomplished by any appropriate technique, in particular, by chemical vapor deposition (CVD), liquid phase epitaxy (LPE) or pulsed laser deposition (PLD), etc. With respect to the materials considered here, reference may be made, for example, to the publications referenced at [2], [3], [4], [5], and [6].

Those skilled in the art will be able to determine the reagents and the operating conditions according to the material that must be grown, and the chosen technique.

The composition of the materials of the different layers is adjusted, through the choice of the elements constituting A, A', A'' and/or A''' and B, B', B'' and/or B''' and their stoichiometry in regard to the desired properties (for example, depending on the application: piezoelectric coupling factor, refraction index, etc.), but also taking into account the need to achieve consistency of the crystal lattice constants of the materials of the epitaxiated layers and their epitaxy support. The adaptation of lattice constants in the field of epitaxy is known to those skilled in the art.

It is understood that in addition to the various epitaxial layers described, additional epitaxial layers may be added, in particular, buffer layers, intended to control the changes of the lattice constants, or of the stored stresses or, alternatively, layers intended to provide selective etching stop layers.

The transfer of the seed layer (or, respectively, of the epitaxial layer) typically implies a step of bonding of the donor substrate and of the receiver substrate, as the seed layer (respectively, epitaxial layer) is located at the bonding interface, followed by a step of thinning of the receiver substrate so as to expose the seed layer (respectively, epitaxial layer).

In a particularly advantageous manner, the transfer is performed using the SMART CUT® method, which is well known for the transfer of thin semiconducting layers, particularly when made of silicon.

Figure 3A:
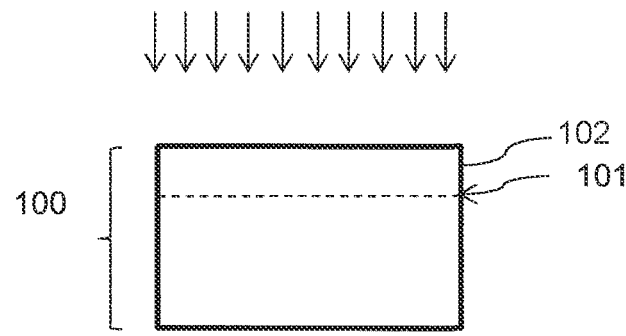
FIGS. 3A to 3E illustrate successive steps of a method of manufacturing a monocrystalline layer according to a first implementation of the disclosure.

To this end, according to the first implementation, with reference to FIG. 3A, a donor substrate 100 of a material of binary composition ABO$_3$ is provided, and an embrittlement area 101, which delimits a monocrystalline layer 102 to be transferred, intended to form the seed layer, is formed by ion implantation (represented diagrammatically by the arrows). In FIG. 3A, donor substrate 100 is represented as homogeneous but, as mentioned above, it could alternatively be composite. Advantageously, and depending on the piezoelectric material in question, the implanted species are hydrogen and/or helium. Those skilled in the art will be able to determine the dose and the implantation energy of these species to form the embrittlement area at a determined depth, which is typically less than 2 µm; typically, and again depending on the material and the implanted species in question, the dose is in the range 2 E+16 to 2 E+17 ionic species/cm$^2$, and the implantation energy is 30 keV to 500 keV. The buried embrittled layer can be obtained by any other means known to those skilled in the art, for example, by porosification of the material or, alternatively, by laser irradiation.

Figure 3B:
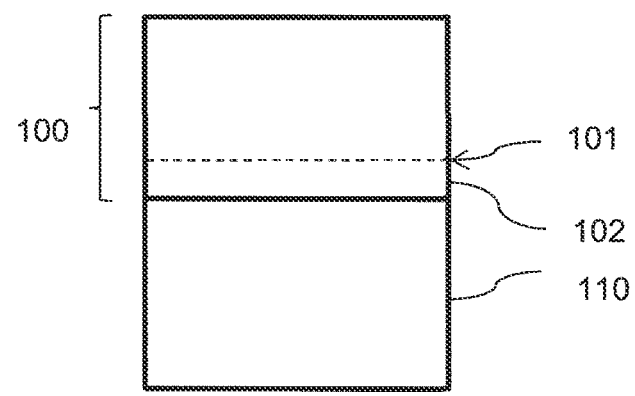

With reference to FIG. 3B, donor substrate 100, embrittled in this manner, is bonded onto receiver substrate 110, where the surface of the donor substrate through which the implantation has been accomplished is at the bonding interface. Before bonding, the donor substrate and/or the receiver substrate may possibly be covered by an electrically insulating or electrically conductive layer (not illustrated), which will have been inserted between the receiver substrate and the seed layer after the transfer.

Figure 3C:
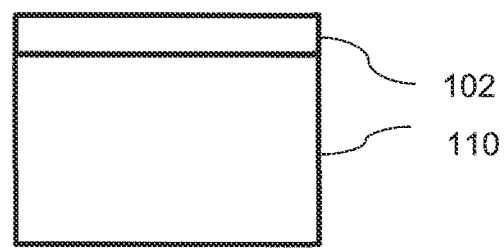

With reference to FIG. 3C, donor substrate 100 is detached along embrittlement area 101. Such detachment can be accomplished by any means known to those skilled in the art, for example, thermal, mechanical or chemical means, etc. The remainder of the donor substrate is then recovered, and may possibly be recycled, enabling monocrystalline layer 102 to be transferred onto receiver substrate 110.

Figure 3D:
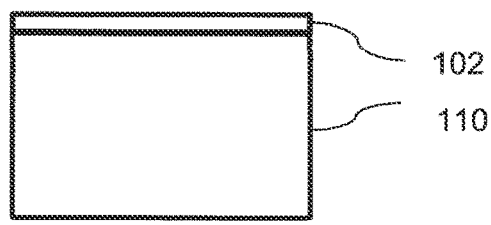

With reference to FIG. 3D, a surface portion of transferred layer 102 can optionally be removed, for example, by mechanical polishing and/or by chemical etching. The purpose of this removal of material is to eliminate any defects relating to the implantation and to the detachment in proximity to the embrittlement area. After this removal, a thinned layer 102 is obtained on receiver substrate 110, which will act as the seed layer for the following epitaxy step. Alternatively, transferred layer 102 of FIG. 3C can be used directly as the seed layer for the epitaxy.

Figure 3E:
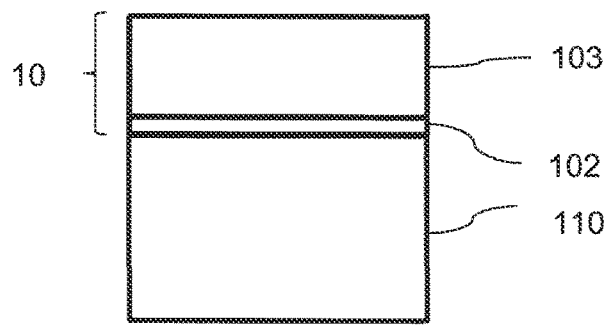

With reference to FIG. 3E, a monocrystalline layer 103 of composition A'B'O3 is made to grow by epitaxy on seed layer 102, where the material of epitaxial layer 103 is different from that of seed layer 102. Seed layer 102 thus imposes its lattice constant and allows a high-quality monocrystalline material to be grown. Growth stops when the thickness desired for the monocrystalline layer is reached. Final layer 10 is formed from the stack of seed layer 102 and epitaxial layer 103. The composition of epitaxial layer 103 may vary at different depths within it, either gradually or discontinuously.

As can be seen in FIG. 3E, after the method that has just been described, a substrate for a surface acoustic wave device or a bulk acoustic wave device is obtained that includes a receiver substrate 110 and a monocrystalline layer 10 on the receiver substrate 110.

Layer 10 includes:
a first portion 102 at the interface with receiver substrate 110, corresponding to the seed layer,
a second portion 103 extending from first portion 102, corresponding to the epitaxial layer, made of a material of composition A'B'O3, where the material can be at least ternary.

This substrate is advantageously used to manufacture a surface acoustic wave device as illustrated in FIG. 1, or a bulk acoustic wave device as illustrated in FIG. 2, or, alternatively, other devices for microelectronics, photonics or integrated optics.

The seed layer is typically less than 2 µm thick, and preferably less than 1 µm thick.

The thickness of the epitaxial layer depends on the specifications of the device intended to incorporate the monocrystalline layer. In this regard, the thickness of the epitaxial layer is not limited either in terms of minimum value or of maximum value. Purely for information, the table below gives combinations of thicknesses of the seed layer and of the epitaxial layer:

| Seed layer | 0.5 µm | 0.05 µm | 0.1 µm | 0.03 µm |
|---|---|---|---|---|
| Epitaxial layer | 2.5 µm | 0.95 µm | 5 µm | 0.15 µm |

FIGS. 4A to 4E illustrate the main steps of the method according to the second implementation, in which epitaxy is implemented before transfer.

Figure 4A:
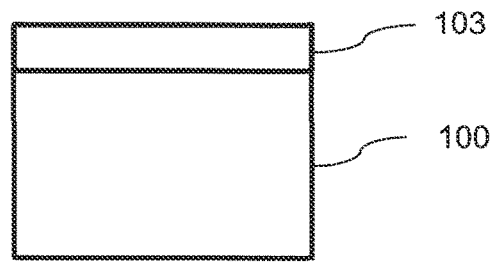
FIGS. 4A to 4E illustrate successive steps of a method of manufacturing a monocrystalline layer according to a second implementation of the disclosure.

With reference to FIG. 4A, a donor substrate 100 is provided, including a piezoelectric material of composition $A'B'O_3$. The donor substrate can be homogeneous (as illustrated in FIG. 4A) or composite; in the latter case, it includes a surface layer of composition $A'B'O_3$. This is the case, in particular, when the material is at least ternary, if there are no ingots consisting of such material. A monocrystalline layer 103 of composition $A''B''O_3$ is then made to grow, by epitaxy, on the material $A'B'O_3$, the material of composition $A'B'O_3$ being used as the seed for the epitaxy. The material of epitaxial layer 103 can be identical to or different from the material of donor substrate 100.

An embrittlement area is then formed in an embrittlement area in donor substrate 100 or in epitaxial layer 103 of composition $A''B''O_3$, so as to delimit a layer that is to be transferred. The embrittlement area can be formed by implantation of ionic species (shown diagrammatically by the arrows in FIG. 4B).

Figure 4B:
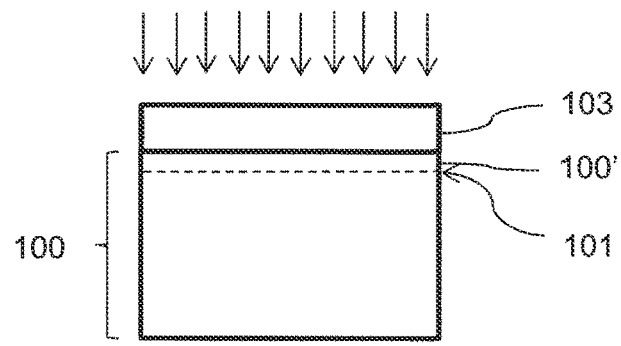

In the example illustrated in FIG. 4B, embrittlement area 101 is formed in donor substrate 100, under epitaxial layer 103. The layer that is to be transferred, in this case, consists of the whole of epitaxial layer 103 and a portion 100' of donor substrate 100.

According to another implementation (not illustrated), the embrittlement area is formed in layer 103. The layer that is to be transferred, in this case, consists of the portion extending between the free surface of layer 103 and embrittlement area 101.

Figure 4C:
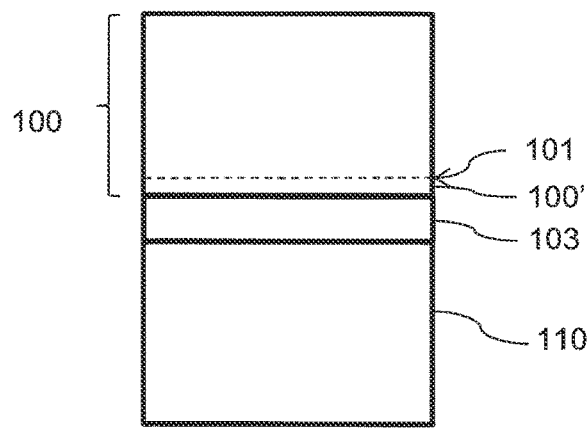

With reference to FIG. 4C, the donor substrate is bonded onto receiver substrate 110, epitaxial layer 103 of composition $A''B''O_3$ being at the bonding interface.

Figure 4D:
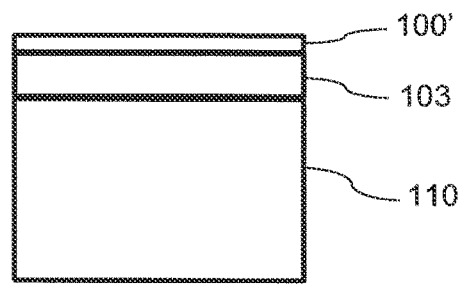

With reference to FIG. 4D, donor substrate 100 is detached along embrittlement area 101 so as to recover the remainder of the donor substrate, and to transfer the layer consisting of layer 103 and portion 100' onto receiver substrate 110.

Figure 4E:
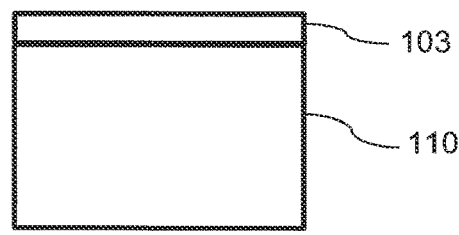

With reference to FIG. 4E, at least a surface portion of the transferred layer is removed. The purpose of this removal is to eliminate at least portion 100', and possibly a portion of layer 103, so as to expose the material of composition $A''B''O_3$.

Layer 103 obtained in this manner can then be used to manufacture a surface acoustic wave or bulk acoustic wave device.

Figure 4F:
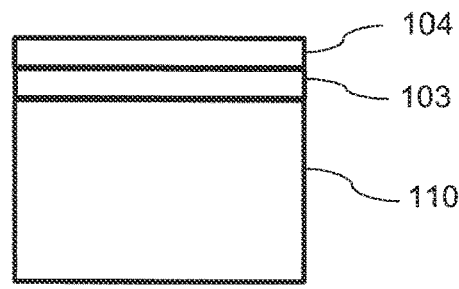
FIG. 4F illustrates an additional step implemented in a variant of the implementation illustrated in FIGS. 4A to 4E.

According to a variant of this second implementation, an additional step is performed, illustrated in FIG. 4F, consisting of a resumption of epitaxy implemented on layer 103 of composition $A''B''O_3$, so as to form an additional monocrystalline layer 104 of composition $A'''B'''O_3$. The material of the additional layer 104 can be identical to that of layer 103, in which case, this latter step of epitaxy results in a thickening of layer 103 (layer 104 is diagrammatically represented separately from layer 103 only so that it can be shown, but is not separate in the final layer, except possibly by its quality). Alternatively, additional layer 104 is made from a material different from that of layer 103.

The thickness of layer 103 and, if applicable, of layer 104, is chosen according to the specifications of the radiofrequency device intended to incorporate the layer. The thickness of layer 103 is typically between 0.05 and 2 µm. The thickness of layer 104 is typically between 0.5 and 20 µm.

Whichever implementation is utilized, as an alternative (not illustrated) to the SMART CUT® method, the transfer can be performed, after bonding of the donor substrate and the receiver substrate, through the removal of material, for example, by mechanical polishing and/or chemical etching of the donor substrate until the seed layer is exposed. This variant is less advantageous as it involves consumption of the donor substrate, whereas the SMART CUT® method allows possible recycling of the donor substrate. Conversely, this variant requires no implantation within the donor substrate.

As can be seen in FIGS. 4E and 4F, after the method according to the second implementation, a substrate for a surface acoustic wave device or a bulk acoustic wave device is obtained that includes a receiver substrate 110 and a monocrystalline layer 103 of composition $A''B''O_3$ on receiver substrate 110 and, if applicable, a layer 104 of composition $A'''B'''O_3$ on layer 103.

This substrate is advantageously used to manufacture a surface acoustic wave device as illustrated in FIG. 1, or a bulk acoustic wave device as illustrated in FIG. 2, where layer 103 or, if applicable, both layers 103 and 104, correspond(s) to layer 10 of FIGS. 1 and 2, or, alternatively, all other microelectronic, photonic or optical devices including a layer.

Figure 5A:
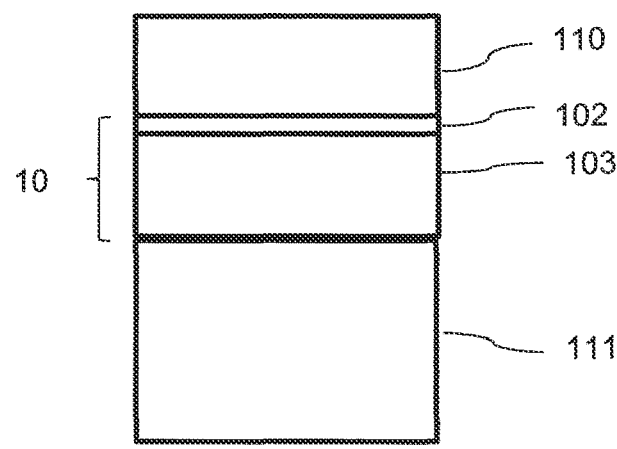
FIGS. 5A to 5C illustrate optional subsequent steps of the method.
Figure 5B:
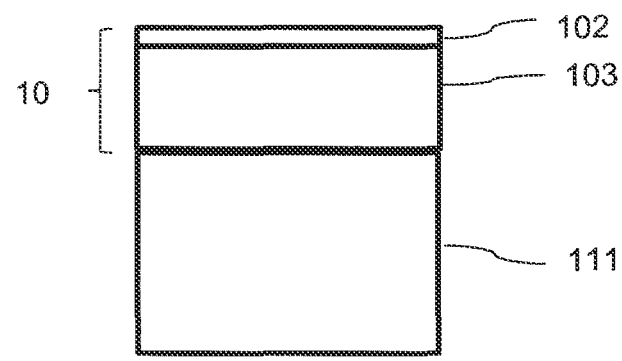
Figure 5C:
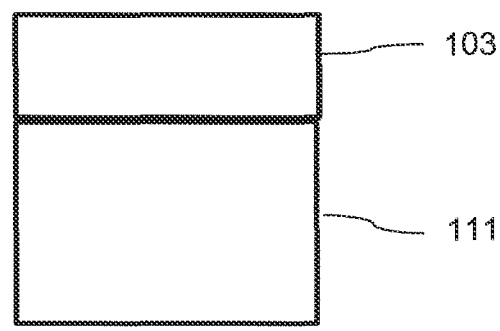

In certain cases, it is possible for the receiver substrate on which the epitaxial growth occurs not to be optimal for the final application. Since the receiver substrate will be subjected to the operating conditions of epitaxy, there is, in fact, a limited choice of suitable materials. In particular, the receiver substrate cannot contain layers or elements that may be damaged by the epitaxy temperature. It can then be advantageous to transfer layer 10 onto a final substrate 111, the properties of which are chosen according to the desired application, by bonding it onto final substrate 111 through the surface of epitaxial layer 103 (cf. FIG. 5A) (or 104, if applicable), and by removing the receiver substrate (cf. FIG. 5B). This transfer can be performed by any transfer technique described above. Another advantage of this transfer onto a final substrate is that seed layer 102, which was buried in the structure produced from epitaxy, is then exposed, and can be removed if needed (cf. FIG. 5C), in particular, if it has defects. Only epitaxial layer 103 (and, if applicable, layer 104) (or a portion of the layer) having the desired characteristics then remains on final substrate 111.

If it is desired to manufacture a surface acoustic wave device, metal electrodes 12, 13 in the form of two interdigitated combs are deposited on the surface of layer 10 opposite receiver substrate 110 or, if applicable, the final substrate (whether this concerns receiver substrate 110 or final substrate 111, the substrate forms the support substrate 11 noted in FIG. 1).

If it is desired to manufacture a bulk acoustic wave device, the method described above must be adapted accordingly. First, before the step of bonding illustrated in FIG. 3B, a first electrode is deposited on the free surface of layer 102, which is to be transferred from the donor substrate, and this first electrode 13 (referenced in FIG. 2) is buried in the final stack. After the step of epitaxial growth illustrated in FIG. 3E a second electrode 12 (noted in FIG. 2) is deposited on the free surface of layer 10, opposite the first electrode. Another option is to transfer the layer onto a final substrate, as mentioned above, and to form the electrodes before and after the transfer. Second, to prevent acoustic waves propagating in receiver substrate 110, a means of isolation can be integrated in this substrate, which can be, for example, a Bragg mirror (as illustrated in FIG. 2) or a cavity previously etched in receiver substrate 110 or in final substrate 111, if applicable.

Whichever implementation is chosen, the method according to the disclosure enables a monocrystalline layer to be formed, which is not only binary but also ternary or quaternary, and thus allows a larger choice of properties for the layer than materials traditionally used for surface acoustic wave or bulk acoustic wave devices. By this means, a satisfactory compromise between the coupling coefficient and the electromechanical efficiency of the piezoelectric material can be obtained more easily.

Another field of application where the development of such solutions of piezoelectric materials is of particular interest is that of micro-sensors and micro-actuators. In the case of micro-sensors, the purpose will, in general, be to measure a deformation caused by an external stress. In the case of micro-actuators, conversely, it will be sought to cause deformation of an element or motion of a moving part by application of an electric field, whether continuous or variable. Use of the piezoelectric material enables mechanical deformation and an electric signal to be linked. In the field of acoustics, for example, the external stress is a pressure wave that deforms a membrane. It can be within the audible spectrum, and objects that may typically be of interest are microphones (in sensor mode) and loudspeakers (in actuator mode). It can go beyond audible frequencies, for example, for the production of Piezo Micromachined Ultrasonic Transducers (PMUT). It may also concern static pressure sensors or, alternatively, inertial sensors (acceleration sensors, gyroscopes, etc.), for which the motion of a moving mass that moves under the effect of acceleration is measured by means of the piezoelectric material. The piezoelectric material comprises the entire deformed element (membrane, beam, cantilever, etc.), or advantageously only a portion of it, by stacking it with other materials such as silicon, for example, in order to ensure improved mechanical properties of the deformable portion. In the actuators category, piezoelectric materials can control a very precise movement and can be used, for example, to expel the ink from printer cartridges, or from micro-fluid systems, or, alternatively, to adjust a focal distance of an optical microsystem.

REFERENCES

[1] W. Steichen and S. Ballandras, "Acoustic components used for filtering—Review of the different technologies," *Techniques de l'Ingenieur*, E2000, 2008
[2] Doctoral thesis (Dipl. Phys. ETH Zurich), "$K_{1-y}Na_yTa_{1-x}NbO_3$ thin film Electro-optics" (Diss. ETH No. 17275)
[3] L. S. Hung, J. A. Agostinelli, J. M. Mir, and L. R. Zheng, "Epitaxial nonlinear optical films of LiTaO3 grown on GaAs in waveguide form," Appl. Phys. Lett. 62 (24), 14 Jun. 1993, p 3071
[4] E. Dogheche and D. Remiens, S. Shikata, A. Hachigo, and H. Nakahata, "High-frequency surface acoustic wave devices based on LiNbO3/diamond multilayered structure," APPLIED PHYSICS LETTERS 87, 213503, 2005
[5] A. Bartasyte, V. Plausinaitiene, A. Abrutis, T. Murauskas, P. Boulet, S. Margueron, J. Gleize, S. Robert, V. Kubilius, and Z. Saltyte, "Residual stresses and clamped thermal expansion in LiNbO3 and LiTaO3 thin films," APPLIED PHYSICS LETTERS 101, 122902 (2012)
[6] Letters to Nature, Nature 432, 84-87 (4 Nov. 2004) doi: 10.1038/nature03028; "Lead-free piezoceramics," Yasuyoshi Saito, Hisaaki Takao, Toshihiko Tani, Tatsuhiko Nonoyama, Kazumasa Takatori, Takahiko Homma, Toshiatsu Nagaya & Masaya Nakamura

What is claimed is:

1. A substrate for a microelectronic, photonic or optical device, comprising:
   a support substrate; and
   a monocrystalline layer of composition A"B"O$_3$ on the support substrate, wherein:
      A" consists of one or more elements selected from the group consisting of: Li, Na, K, and H;
      B" consists of one or more elements selected from the group consisting of: Nb, Ta, Sb, and V; and
      at least one of A" and B" consists of at least two elements; and
   a layer of composition A'B'O$_3$ between the support substrate and the layer of composition A"B"O$_3$, wherein:
      A' consists of at least one element selected from the group consisting of: Li, Na, K, and H, and
      B' consists of at least one element selected from the group consisting of: Nb, Ta, Sb, and V.

2. The substrate of claim 1, further comprising, on the layer of composition A"B"O$_3$, a monocrystalline layer of composition A'''B'''O$_3$, wherein:
   A''' consists of one or more elements selected from the group consisting of: Li, Na, K, and H; and
   B''' consists of one or more elements selected from the group consisting of: Nb, Ta, Sb, and V.

3. A surface acoustic wave device, comprising:
   the substrate of claim 1; and
   two electrodes on the surface of the monocrystalline layer of composition A"B"O$_3$, and wherein the monocrystalline layer of composition A"B"O$_3$ comprises a piezoelectric material.

4. A bulk acoustic wave device, comprising:
   the substrate of claim 1, and
   two electrodes on opposite faces of the monocrystalline layer of composition A"B"O$_3$, and wherein the monocrystalline layer of composition A"B"O$_3$ comprises a piezoelectric material.

5. A micro-sensor for measuring a deformation caused by an external stress, comprising the substrate of claim 1.

6. A micro-actuator for causing a deformation of an element or motion of a moving part, through the application of a continuous or variable electric field, comprising the substrate of claim 1.

7. The substrate of claim 1, wherein the formula of A'B'O$_3$ is $Li_{x1}K_{1-x1}Nb_{y1}Ta_{1-y1}O_3$, where $0 \leq x1 \leq 1$ and $0 \leq y1 \leq 1$.

8. The substrate of claim 1, wherein the formula of A"B"O$_3$ is $Li_{x2}K_{1-x2}Nb_{y2}Ta_{1-y2}O_3$, where $0 \leq x2 \leq 1$ and $0 \leq y2 \leq 1$.

9. The substrate of claim 2, wherein the formula of A"B"O$_3$ is $Li_{x3}K_{1-x3}Nb_{y3}Ta_{1-y3}O_3$, where $0 \leq x3 \leq 1$ and $0 \leq y3 \leq 1$.

10. The substrate of claim 1, wherein A" is identical to A'.

11. The substrate of claim 10, wherein B" is different than B'.

12. The substrate of claim 1, wherein B" is identical to B'.

13. The substrate of claim 12, wherein A" is different than A'.

14. The substrate of claim 2, wherein A'" is different than A".

15. The substrate of claim 2, wherein B'" is different than B".

16. The substrate of claim 1, wherein $A'B'O_3$ is a ternary or higher order composition.

17. The substrate of claim 1, wherein $A'B'O_3$ is a binary composition.

18. The substrate of claim 17, wherein $A"B"O_3$ is a ternary or higher order composition.

19. The substrate of claim 1, wherein the monocrystalline layer of composition $A"B"O_3$ has a thickness of less than 20 μm.

20. The substrate of claim 2, wherein the layer of composition $A'"B'"O_3$ has a thickness of less than 20 μm.

* * * * *

UNITED STATES PATENT AND TRADEMARK OFFICE
CERTIFICATE OF CORRECTION

| | |
|---|---|
| PATENT NO. | : 12,356,858 B2 |
| APPLICATION NO. | : 17/396374 |
| DATED | : July 8, 2025 |
| INVENTOR(S) | : Bruno Ghyselen and Jean-Marc Bethoux |

It is certified that error appears in the above-identified patent and that said Letters Patent is hereby corrected as shown below:

In the Specification

| | | |
|---|---|---|
| Column 1, | Line 43, | change "*l'Ingenieur*" to --*l'Ingénieur*-- |
| Column 2, | Line 20, | change "are ZnO and" to --are AlN, ZnO and-- |
| Column 3, | Line 30, | change "from A''' is understood" to --from A''' is understood-- |
| Column 5, | Line 11, | change "A''B''O$_{on}$ the" to --A''B''O$_3$ on the-- |
| Column 10, | Line 41, | change "composition A'B'03 is made" to --composition A'B'O$_3$ is made-- |
| Column 10, | Line 61, | change "composition A'B'03 where" to --composition A'B'O$_3$ where-- |
| Column 11, | Lines 19-20, | change "composition A'B'03. The donor" to --composition A'B'O$_3$. The donor-- |
| Column 11, | Line 22, | change "composition A'B'03. This" to --composition A'B'O$_3$. This-- |
| Column 11, | Line 25, | change "composition A''B''03 is then" to --composition A''B''O$_3$ is then-- |
| Column 11, | Line 26, | change "material A'B'03, the material" to --material A'B'O$_3$, the material-- |
| Column 11, | Line 32, | change "composition A''B''03, so as to" to --composition A''B''O$_3$, so as to-- |
| Column 11, | Lines 47-48, | change "composition A''B''03 being" to --composition A''B''O$_3$ being-- |
| Column 11, | Lines 57-58, | change "composition A''B''03." to --composition A''B''O$_3$.-- |
| Column 11, | Line 65, | change "composition A''B''03, so as to" to --composition A''B''O$_3$, so as to-- |
| Column 11, | Line 66, | change "composition A''B''03. The material" to --composition A'''B'''O$_3$. The material-- |
| Column 13, | Line 59, | change "*l'Ingenieur*," to --*l'Ingénieur*,-- |

Signed and Sealed this
Twenty-sixth Day of August, 2025

Coke Morgan Stewart
*Acting Director of the United States Patent and Trademark Office*

In the Claims

Claim 9, Column 14, Lines 61-62, change "formula of $A''B''O_3$ is" to --formula of $A'''B'''O_3$ is--